(12) United States Patent
Venkatesh

(10) Patent No.: US 7,906,872 B2
(45) Date of Patent: Mar. 15, 2011

(54) DYNAMIC HARMONIC FILTER FOR AN AC POWER SYSTEM

(75) Inventor: Raghavan Venkatesh, Aurangabad (IN)

(73) Assignee: Crompton Greaves Limited, Mumbai (IN)

( * ) Notice: Subject to any disclaimer, the term of this patent is extended or adjusted under 35 U.S.C. 154(b) by 219 days.

(21) Appl. No.: 12/161,556

(22) PCT Filed: Mar. 2, 2006

(86) PCT No.: PCT/IN2006/000073
§ 371 (c)(1),
(2), (4) Date: Nov. 4, 2008

(87) PCT Pub. No.: WO2007/072492
PCT Pub. Date: Jun. 28, 2007

(65) Prior Publication Data
US 2009/0206950 A1 Aug. 20, 2009

(51) Int. Cl.
*H02M 1/12* (2006.01)
*H03H 7/00* (2006.01)
(52) U.S. Cl. ........ 307/105; 333/175; 333/176; 333/177; 333/181
(58) Field of Classification Search .................. 307/105; 333/175, 176, 177, 181
See application file for complete search history.

(56) References Cited

U.S. PATENT DOCUMENTS

| | | | |
|---|---|---|---|
| 4,760,356 A | 7/1988 | Kempster | |
| 5,619,080 A * | 4/1997 | Pennington et al. | 307/105 |
| 6,577,487 B2 * | 6/2003 | Gertmar | 361/113 |
| 2008/0129122 A1 * | 6/2008 | Yu et al. | 307/105 |

FOREIGN PATENT DOCUMENTS

| | | |
|---|---|---|
| JP | 63-179603 | 7/1988 |
| JP | 10-201224 | 7/1998 |

OTHER PUBLICATIONS

International Search Report dated Oc. 16, 2006 for International Application No. PCT/IN2006/000073.

* cited by examiner

*Primary Examiner* — Albert W Paladini
*Assistant Examiner* — Hal I Kaplan
(74) *Attorney, Agent, or Firm* — Klein, O'Neill & Singh, LLP

(57) ABSTRACT

A dynamic harmonic filter for an AC power system comprising at least one voltage source and at least one load is provided. The harmonic filter comprises a current sensing or voltage injection transformer connected in series with the voltage source and the load. One end of the primary of the transformer is connected to the voltage source, and the other end is connected to the load. The harmonic filter further comprises a parallel resonant LC circuit tuned to the fundamental frequency of the power system. One end of the secondary ($S_2$) of the current injection of the voltage sensing transformer is connected to one junction of the parallel resonant LC circuit and the other end of the secondary of the current injection or voltage sensing transformer is connected to the other junction of the parallel resonant LC circuit through the secondary ($S_1$) of the current sensing or voltage injection transformer.

23 Claims, 10 Drawing Sheets

DYNAMIC HARMONIC FILTER FOR AN AC POWER SYSTEM

FIELD OF INVENTION

This invention relates to a dynamic harmonic filter for an AC power system.

This invention also relates to an AC power system comprising the dynamic harmonic filter.

PRIOR ART

With the increasing proportion of non-linear loads, the harmonic pollution in electric power systems is increasing leading to increased power losses and overloading and malfunctioning of power equipments and reducing the reliability of the equipments. Due to the system impedance, the harmonic currents generated by various loads manifest in the form of voltage harmonics leading to further degradation of the power quality and failure of equipments such as capacitor banks, transformers etc. In general most of the harmonic distortion in power systems is created by the harmonic current generation loads, which are referred to as non-linear loads. There are several current harmonic filters for use in AC power systems.

A first type of current harmonic filter is based on the principle of using special transformer winding configuration to prevent the flow of harmonic currents from the loads to the source. An example of this type is to have one of the windings of a two winding transformer connected in delta configuration to trap the triplen (3n or zero sequence) harmonics. Another example of this type is to have two transformers connected in parallel and having the winding configurations as delta-star and star-star and feed two loads and make effective use of the phase shift to cancel the harmonics on the voltage source side. Such filters are expensive and are generally effective only for filtering certain harmonics (3n) and are not suitable for all types of loads. Also they need the transformers to be rated for a larger current due to the circulating currents in the delta winding. The circulating currents also lead to distortions in flux and hence in the voltage.

A second type of current harmonic filter is based on the principle of series resonant L-C circuits tuned for harmonic frequency and connected in parallel with the harmonic loads. These filters are commonly used and offer very low impedance to the flow of harmonic current thereby effectively bypassing most of the harmonic currents and reducing the harmonic currents flowing into the power system. Such filters, however, require a large number of tuned sections to be connected in the circuits as each tuned section can filter only one harmonic current. Typically two to five tuned sections are used to filter most commonly occurring harmonics. Besides the filtering efficiency of these filters depends upon the system frequency and their efficiencies could be adversely affected in power systems where the system frequency widely varies.

A third type of current harmonic filter comprises series resonant L-C circuits tuned to harmonic frequencies and connected in parallel with the harmonic loads. The resonant frequencies of the circuits are variable by varying the value of L (inductance) or C (capacitance) using special control circuits, which track the system frequencies and maintain a constant filtering efficiency. These filters require multiple stages to filter multiple harmonics. Also the control circuits for varying the resonant frequencies are quite complex and expensive.

A fourth type of current harmonic filter comprises parallel resonant L-C tuned circuits, tuned to harmonic frequencies, connected in series with the load and the source. The parallel tuned circuits offer large impedance to the flow of harmonic currents from the load into the voltage source. These filters require shunt filters across the load to bypass the harmonic currents. The performance of the filters depends upon the system frequency and their performance is poor where the system frequency is widely varying. Also these filters offer considerable impedance for the flow of power frequency current, especially with varying system frequencies, thus affecting the system voltage regulation. Power losses associated with such filters are very high, especially for larger loads.

A fifth type of current harmonic filter comprises series resonant L-C circuits tuned for power frequency (fundamental frequency) of the power system and connected in series with the load and the voltage source. These circuits offer negligible impedance for the flow of power frequency current and offer very high impedance to the flow of harmonic currents thereby effectively limiting the harmonic currents flowing into the voltage source. These filters also need shunt filters to bypass the harmonic currents. The performance of these filters depends upon the system frequency variations. They are associated with large power losses that affect the system voltage regulation.

While the above filters are known as passive harmonic current filters, there are also active current/voltage harmonic filters comprising current/voltage sensors for detecting/sensing harmonics present in the current/voltage, power electronic devices and complex electronic control circuits for generating current/voltage harmonics of the desired nature and passive devices for injecting the generated current/voltage harmonics into the power system at appropriate point. These active harmonic filters generate currents/voltages of the same magnitude but in phase opposition to harmonics currents/voltages that are to be filtered. The harmonic currents/voltages are generated through the switching of power electronic devices and the switching sequence is controlled by complex electronic hardware and software. Injection of these currents/voltages into the system effectively cancels the undesired current/voltage harmonics. While these types of filters have the advantage that with one filter a wide spectrum of current/voltage harmonics can be filtered and that their performance does not depend upon the system frequency and its variation, they are very expensive, require complex control circuits and have large power losses associated with them. These filters also comprise complex and expensive power electronic devices, high performance hardware and software and complex monitoring and control circuits.

Combinations of active current harmonic filters and active voltage harmonic filters to eliminate both current and voltage harmonics are known and comprise of both the series and shunt sensing and injection devices, complex power electronic circuits, hardware, software etc. They are generally classified as unified power conditioners and have the disadvantages of high cost, complexity and high power losses.

Combinations of one or more of the above mentioned harmonic elimination devices to enhance performance of power systems are in general referred to as hybrid filters. They comprise of some sections of passive and some sections of active filters and combine the advantages of low cost of passive filters and efficiency of active filters. In most cases they deploy a shunt passive filter for eliminating current harmonics and a series active filter for eliminating voltage harmonics. These types of filters have the disadvantages of high cost, complexity associated with active filtering section and require complex hardware and software for operation.

OBJECTS OF THE INVENTION

An object of the invention is to provide a dynamic harmonic filter for an AC power system, which filters multiple or wide spectrum of current harmonics and/or voltage harmonics with a single filter and is simple in construction and economical.

Another object of the invention is to provide a dynamic harmonic filter for an AC power system that reduces the harmonic loading on the upstream power equipments in the power system to deliver power of improved quality.

Another object of the invention is to provide a dynamic harmonic filter for an AC power system whose performance is of reduced sensitivity to system frequency variation.

Another object of the invention is to provide a dynamic harmonic filter for an AC power system, which reduces the harmonic distortion in voltage being applied to down stream equipments in the system and provides a clean voltage to the connected loads.

Another object of the invention is to provide a dynamic harmonic filter for an AC power system, which reduces harmonics in the power system and prevents malfunctioning and failure of equipments in the power system due to harmonics.

Another object of the invention is to provide a dynamic harmonic filter for an AC power system that allows continued normal operation of the power system in the event of fault in the harmonic filter.

Another object of the invention is to provide an AC power system comprising the above dynamic harmonic filter.

DESCRIPTION OF THE INVENTION

According to the invention there is provided a dynamic harmonic filter for an AC power system comprising at least one voltage source and at least one load, the dynamic harmonic filter comprising a current sensing or voltage injection transformer connected in series with the voltage source and the load with one end of the primary of the current sensing or voltage injection transformer connected to the voltage source and the other end of the primary of the current sensing or voltage injection transformer connected to the load, a current injection or voltage sensing transformer connected in parallel with the voltage source with one end of the primary of the current injection or voltage sensing transformer connected to the point of common coupling between the voltage source and the primary of the current sensing or voltage injection transformer and the other end of the primary of the current injection or voltage sensing transformer earthed, the transformation ratio between the two transformers being unity, and a parallel resonant LC circuit tuned to the fundamental frequency of the power system, one end of the secondary of the current injection or voltage sensing transformer being connected to one junction of the parallel resonant LC circuit and the other end of the secondary of the current injection or voltage sensing transformer being connected to the other junction of the parallel resonant LC circuit through the secondary of the current sensing or voltage injection transformer.

According to the invention there is also provided an AC power system comprising at least one voltage source and at least one load and a dynamic harmonic filter comprising a current sensing or voltage injection transformer connected in series with the voltage source and the load with one end of the primary of the current sensing or voltage injection transformer connected to the voltage source and the other end of the primary of the current sensing or voltage injection transformer connected to the load, a current injection or voltage sensing transformer connected in parallel with the voltage source with one end of the primary of the current injection or voltage sensing transformer connected to the point of common coupling between the voltage source and the primary of the current sensing or voltage injection transformer and the other end of the primary of the current injection or voltage sensing transformer earthed, the transformation ratio between the transformers being unity and a parallel resonant LC circuit tuned to the fundamental frequency of the power system, one end of the secondary of the current injection or voltage sensing transformer being connected to one junction of the parallel resonant LC circuit and the other end of the secondary of the current injection or voltage sensing transformer being connected to the other junction of the parallel resonant LC circuit through the secondary of the current sensing or voltage injection transformer.

According to an embodiment of the invention, the dynamic harmonic filter includes a series resonant LC circuit tuned to the fundamental frequency of the power system and connected across the secondary of the current sensing or voltage injection transformer.

According to another embodiment of the invention, the dynamic harmonic filter includes a series resonant LC circuit tuned to the fundamental frequency of the power system and connected across the secondary of the current sensing or voltage injection transformer and a first bypass switch connected across the primary of the current sensing or voltage injection transformer.

According to another embodiment of the invention, the dynamic harmonic filter includes a series resonant LC circuit tuned to the fundamental frequency of the power system and connected across the secondary of the current sensing or voltage injection transformer, a first bypass switch connected across the primary of the current sensing or voltage injection transformer and a second bypass switch connected in series with the one end of the primary of the current injection or voltage sensing transformer.

The transformation ratio of the two transformers is variable such that the net transformation ratio between the two transformers is unity. Preferably the transformation ratio between the transformers is varied by onload tap changers or off circuit tap changers. The tuning frequency of the series resonant LC circuit or that of the parallel resonant LC circuit is variable. Preferably the tuning frequency of the series resonant LC circuit or that of the parallel resonant LC circuit is varied by varying the capacitance or inductance thereof. Preferably the current sensing or voltage injection transformer is a series transformer and the current injection or voltage-sensing transformer is a shunt transformer. The harmonic filter of the invention is a current harmonic filter or a voltage harmonic filter or a combined harmonic filter for simultaneous filtration of both current and voltage harmonics. The AC power system is single phase, three phase or multiphase and the harmonic filter is correspondingly configured.

The following is a detailed description of the invention with reference to the accompanying drawings, in which.

Figure 5:
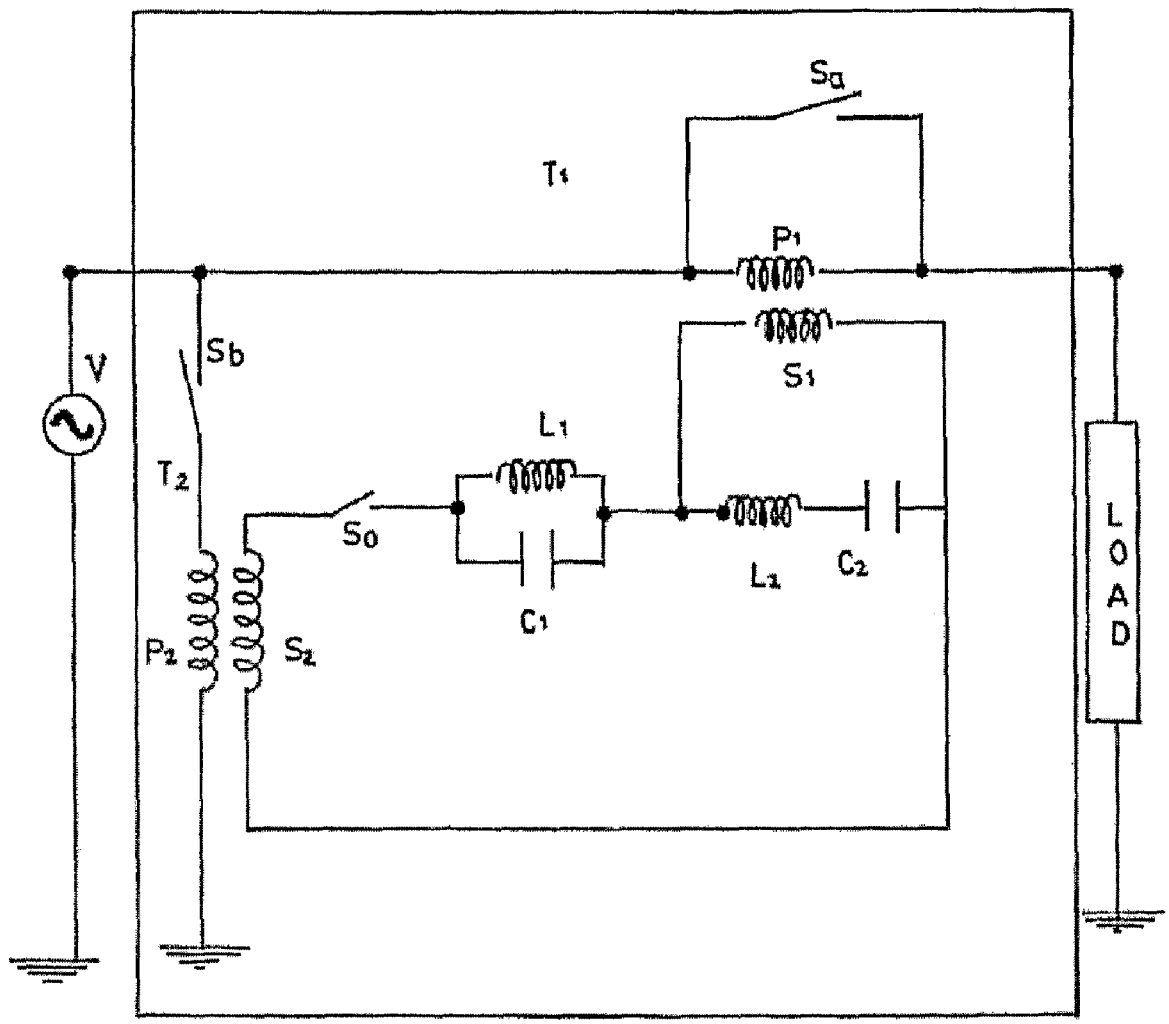
FIG. 5 is a circuit diagram of a typical harmonic filter of FIG. 4 used for computer simulation of the performance thereof.
Figure 13:
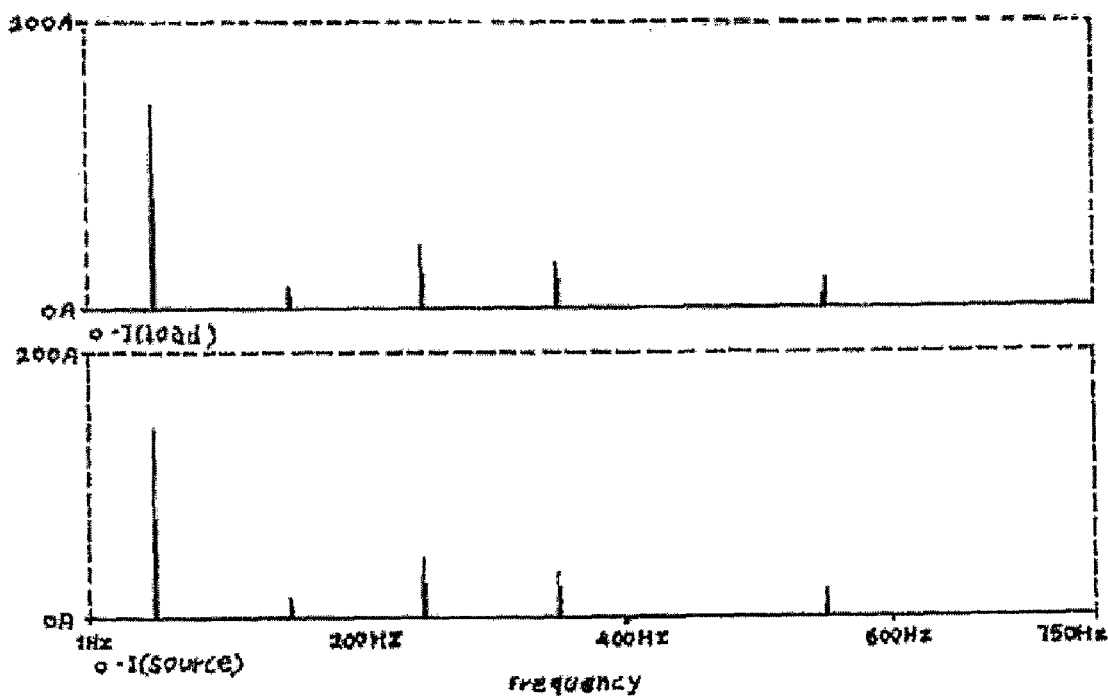
Figure 14:
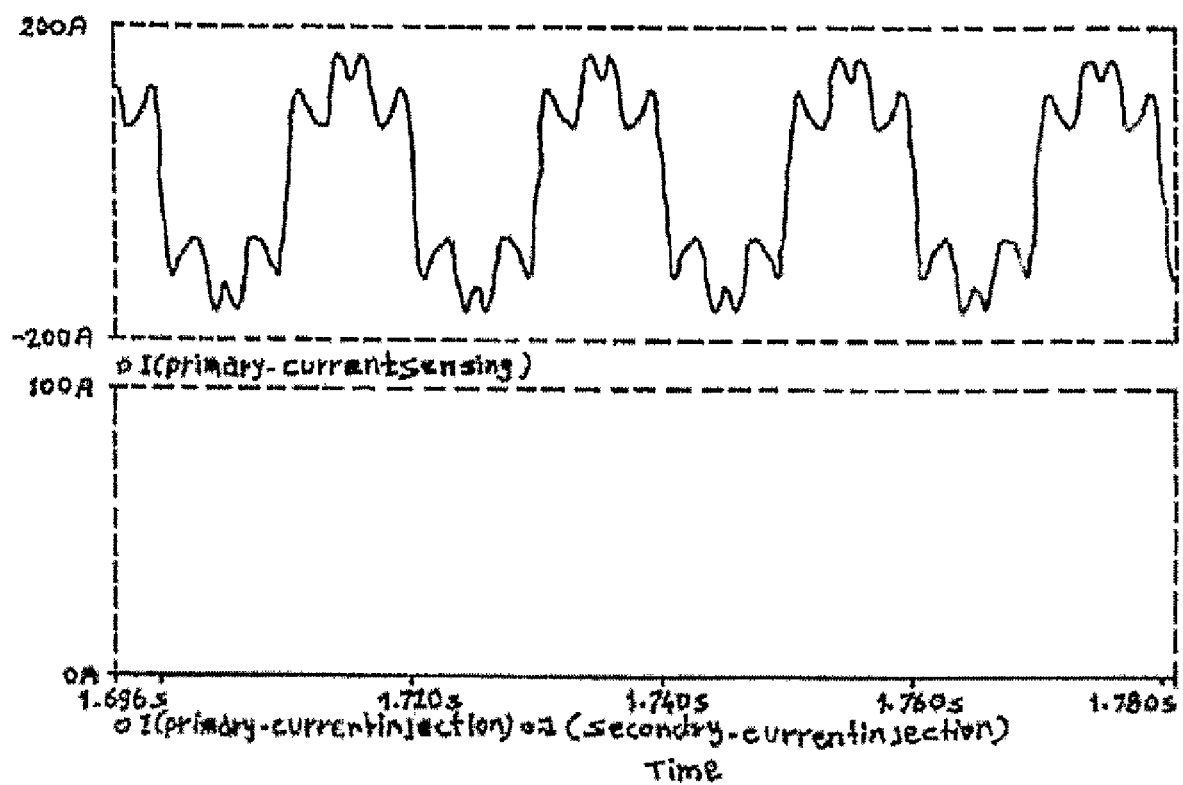

FIG. 13 is a computer simulated harmonic spectrum of load and source currents without the current harmonic filter in operation in the circuit diagram of FIG. 5; and FIG. 14 is a computer generated wave forms of currents flowing in the primary of current sensing transformer and primary and secondary of current injection transformer without the current harmonic filter in operation in the circuit diagram of FIG. 5.

Figure 1:
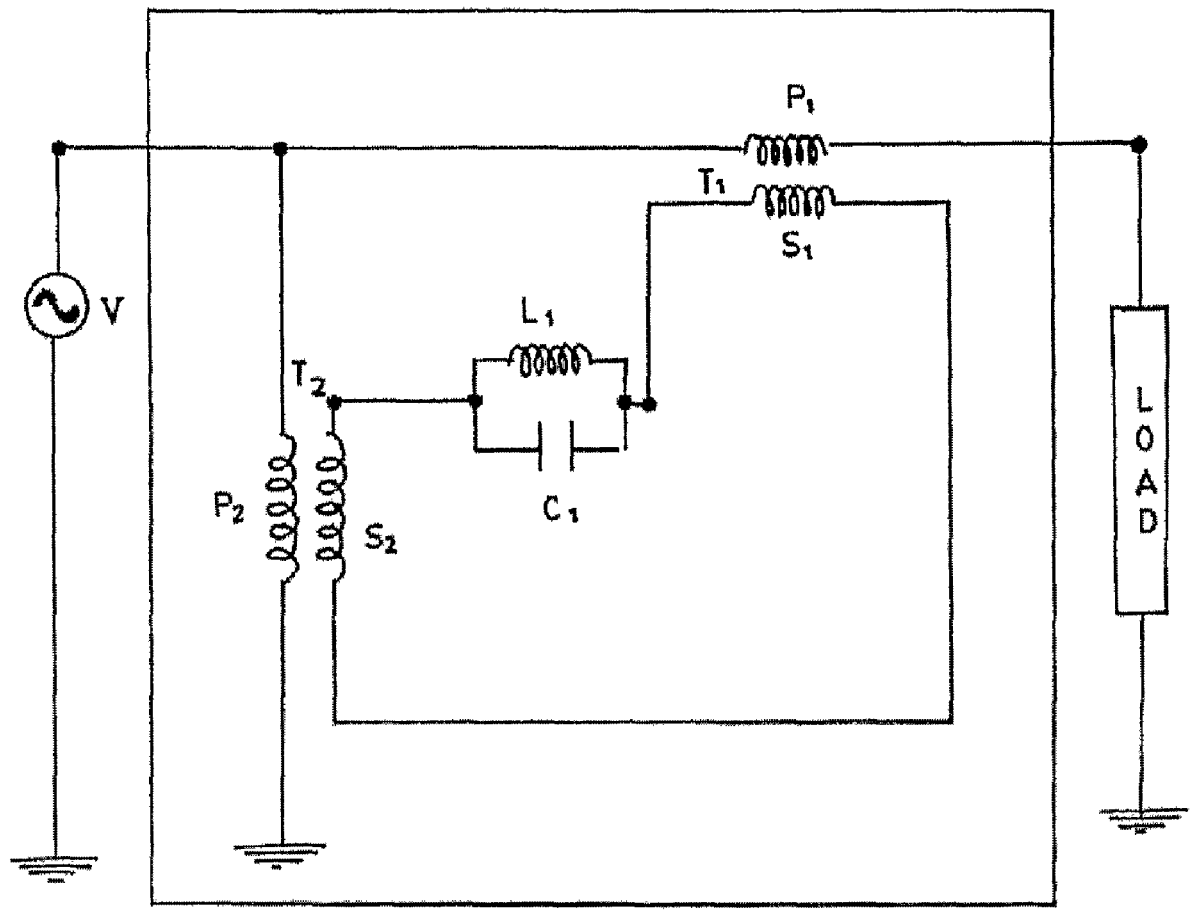
FIG. 1 is a circuit diagram of a dynamic harmonic filter connected in an AC power system according to an embodiment of the invention.

The harmonic filter as illustrated in FIG. 1 of the accompanying drawings comprises a current sensing or voltage injection transformer $T_1$ (primary and secondary marked $P_1$ and $S_1$ respectively) connected in series with a voltage source V and a load with one end of the primary of the transformer $T_1$ connected to the voltage source and the other end of the primary of the transformer $T_1$ connected to the load. $T_2$ is a current injection or voltage sensing transformer (primary and secondary marked $P_2$ and $S_2$ respectively) connected in parallel with the voltage source with one end of the primary of the transformer $T_2$ connected to the point of common coupling between the voltage source and the primary of the transformer $T_1$ and the other end of the primary of the transformer $T_2$ earthed. $L_1C_1$ is a parallel resonant circuit tuned to the fundamental frequency of the power system. One end of the secondary of the transformer $T_2$ is connected to one junction of the $L_1C_1$ circuit and the other end of the secondary of the transformer $T_2$ is connected to the other junction of the $L_1C_1$ circuit through the secondary of the transformer $T_1$. The transformation ratio between the two transformers is unity, i.e., 1.

Figure 2:
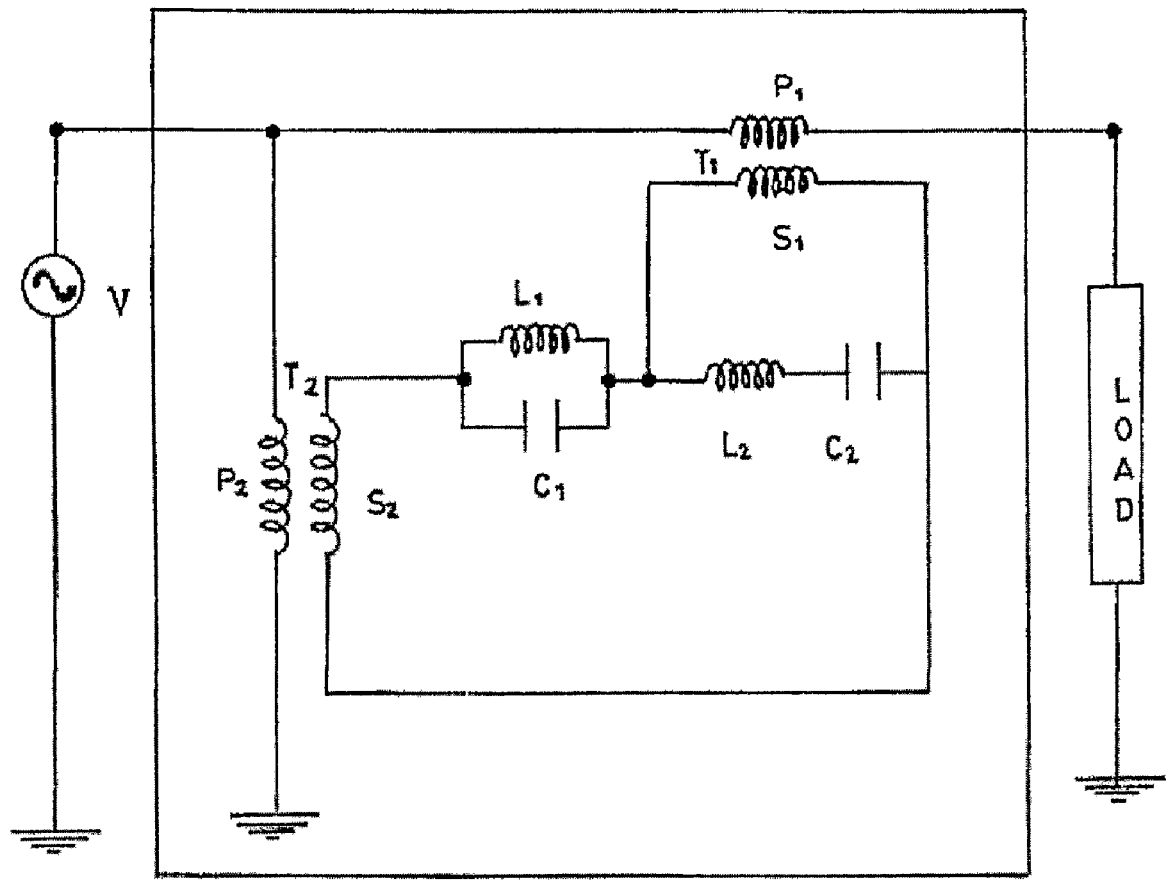
FIG. 2 is a circuit diagram of a dynamic harmonic filter connected in an AC power system according to another embodiment of the invention.

The harmonic filter as illustrated in FIG. 2 of the accompanying drawings includes a series resonant $L_2C_2$ circuit tuned to the fundamental frequency of the power system and connected across the secondary of the transformer $T_1$. The $L_2C_2$ circuit forms a closed loop with the secondary of the transformer $T_1$ in order to provide a low resistance path for the fundamental currents to flow and circulate in the circuit comprised of the secondary of transformer $T_1$ and the series tuned $L_1C_1$ circuit.

Figure 3:
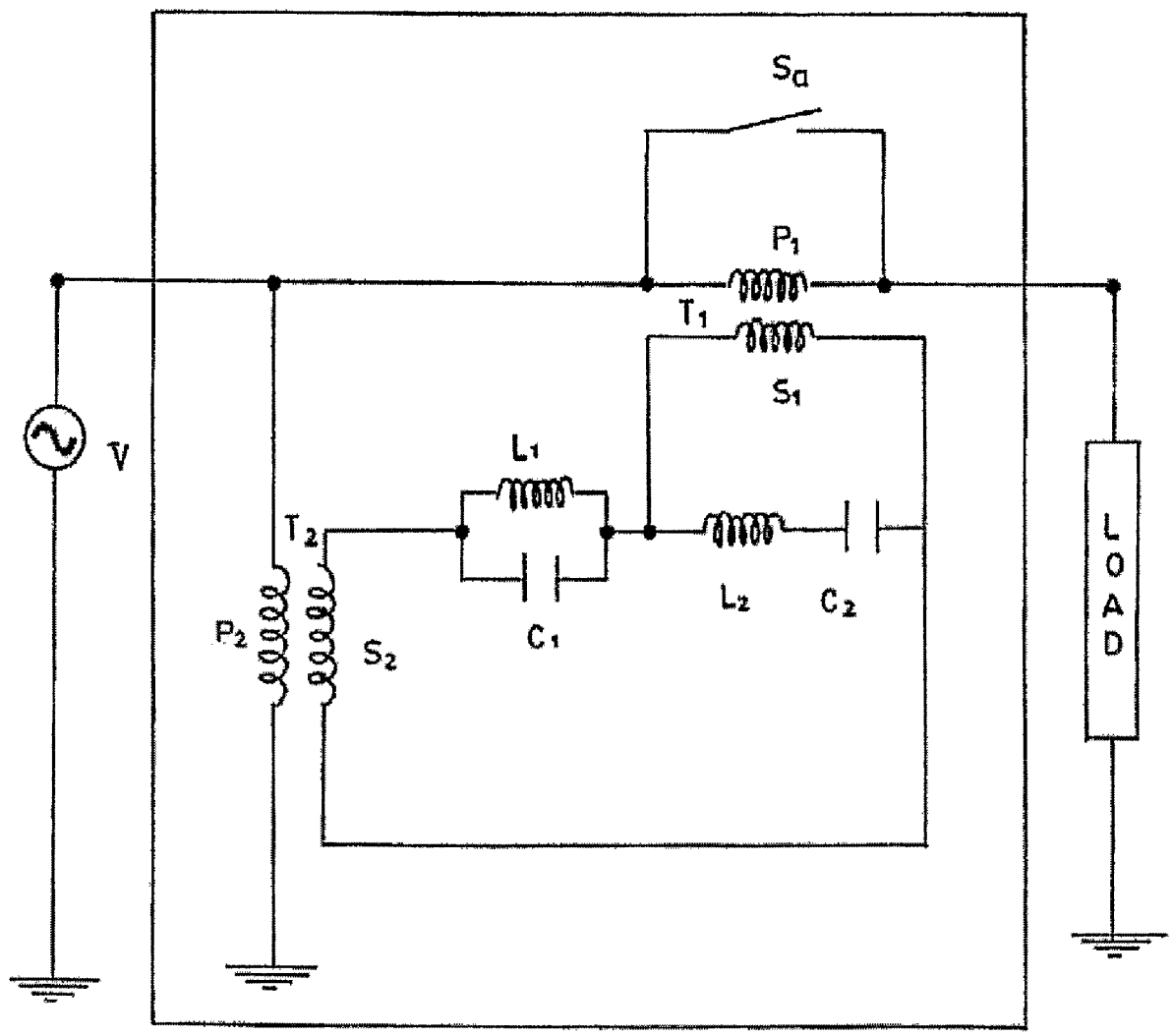
FIG. 3 is a circuit diagram of a dynamic harmonic filter connected in an AC power system according to another embodiment of the invention.

The circuit diagram of FIG. 3 of the accompanying drawings includes in addition to the $L_2C_2$ circuit a first bypass switch Sa connected across the primary of transformer $T_1$ for bypassing the filter circuit in order to facilitate the continued operation of the power system in the event of fault in the filter circuit.

Figure 4:
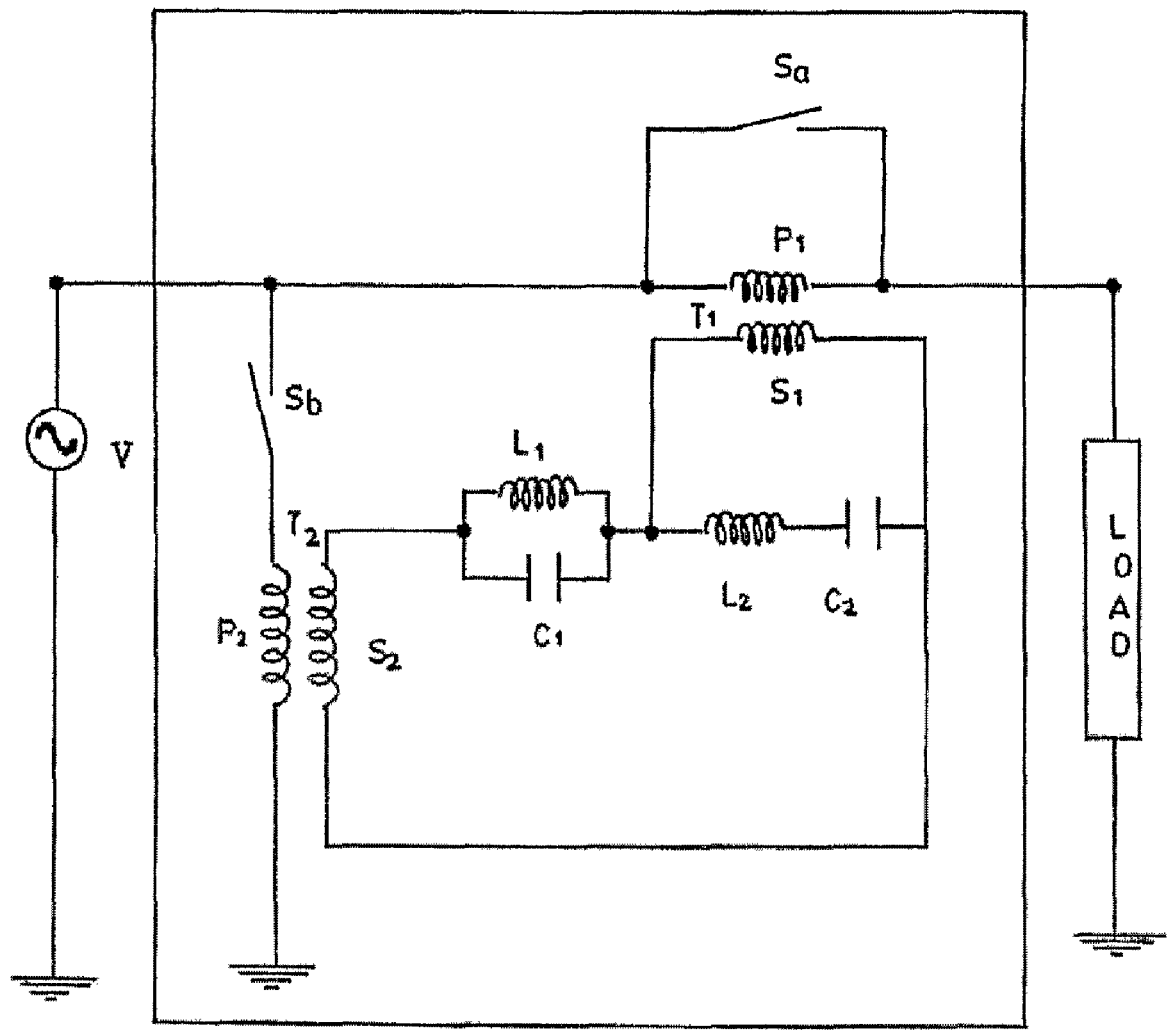
FIG. 4 is a circuit diagram of a dynamic harmonic filter connected in an AC power system according to another embodiment of the invention.

The circuit diagram of FIG. 4 of the accompanying drawings includes in addition to the $L_2C_2$ circuit and bypass switch Sa, a second bypass switch Sb in series with primary of the transformer $T_2$ for isolating the filter circuit from the power system if required in the event of a fault in the filter circuit and for facilitating continued operation of the power system.

a) Functioning of the harmonic filter of FIG. 1 to 4 as current harmonic filter is as follows:

The transformers $T_1$ and $T_2$ are current sensing and current injection transformers, respectively. The current flowing through the load comprises both fundamental current and harmonic components. While flowing to the voltage source through the primary of the transformer $T_1$ this current produces a proportional current signal in the secondary of the transformer $T_1$. The proportionality of the current signal depends upon the transformation ratio of the transformer $T_1$. The current induced in the secondary of the transformer $T_1$ also comprises fundamental current as well as harmonic components. The parallel resonant $L_1C_1$ circuit tuned to fundamental frequency of the power system offers a very high impedance to the flow of fundamental current through the circuit comprised of two secondaries of the transformers $T_1$ and $T_2$ and the parallel tuned $L_1C_1$ circuit. The impedance offered to the flow of harmonic components through the $L_1C_1$ circuit and the secondaries of the transformers $T_1$ and $T_2$ is low and the harmonic components flow through the secondary of the transformer $T_2$. The harmonic current flowing through the secondary of the transformer $T_2$, induces a proportional current in the primary of the transformer $T_2$, the proportionality depending upon the transformation ratio of the transformer $T_2$. The transformation ratios of the two transformers $T_1$ and $T_2$ are so chosen that the net transformation ratio is unity. The primary of the transformer $T_2$ is connected in parallel to the voltage source at the point of common coupling of the voltage source and one end of the primary of the transformer $T_1$. The polarity of the transformer $T_2$ is so chosen as to inject the harmonic currents in phase opposition (180 degrees phase shifted) to the harmonic currents flowing to the voltage source through the primary of transformer $T_1$. This harmonic current injection at phase opposition at the point of common coupling between the voltage source and one end of the primary of transformer $T_1$, effectively cancels out the harmonic currents dynamically thereby limiting the total current harmonic distortion in the upstream system.

b) Functioning of the harmonic filters of FIGS. 1 to 4 as voltage harmonic filters is as follows:

The transformers $T_1$ and $T_2$ of FIG. 1 are voltage injection and voltage sensing transformers, respectively. The voltage across the voltage source comprises both fundamental and harmonic components. This voltage appearing across the primary of the transformer $T_2$ produces a proportional voltage signal in secondary thereof. The proportionality depends upon the transformation ratio of the transformer $T_2$. The voltage induced in the secondary of the transformer $T_2$ also comprises of fundamental as well as harmonic components. The parallel resonant $L_1C_1$ circuit tuned to fundamental frequency of the power system offers a very high impedance to the flow of fundamental voltage through the circuit comprising of two secondaries of the transformers $T_1$ and $T_2$ and the parallel tuned $L_1C_1$ circuit. The impedance offered to the flow of harmonic components through the $L_1C_1$ circuit and the secondaries of the transformers $T_1$ and $T_2$ is low and the harmonic components flow through the secondary of the transformer $T_1$. The harmonic voltage appearing across the secondary of the transformer $T_1$, induces a proportional voltage in the primary of the transformer $T_1$, the proportionality depending upon the transformation ratio of the transformer $T_1$. The transformation ratios of the two transformers $T_1$ and $T_2$ are so chosen that the net transformation ratio is maintained at unity. The polarity of the transformer $T_1$ is so chosen as to inject the harmonic voltage signals in phase opposition (180 degrees phase shifted) to the harmonic voltage of the source, as to dynamically cancel the harmonics and limit the voltage harmonic distortion appearing on the load.

c) Functioning of the harmonic filters of FIGS. 1 to 4 as combined or composite current and voltage harmonic filters is as follows:

The transformers $T_1$ and $T_2$ are both current/voltage sensing transformer and current/voltage injection transformer, respectively. While the transformers $T_1$ and $T_2$ function as current sensing transformer and current injection transformer respectively, they capture the total load current (fundamental current as well as harmonic current) and transform the current into the secondary side of transformer $T_1$ for extraction of harmonic currents by the tuned $L_1C_1$ circuit and injection of the harmonic current at appropriate phase at the point of common coupling through the transformer $T_2$ so as to limit current distortion in the power system as described earlier. The transformers $T_1$ and $T_2$ simultaneously also function as voltage injection and voltage sensing transformers, respectively capturing total voltage (both fundamental and harmonic) and transforming the voltage into the secondary side of the transformer $T_2$ for extraction of harmonics by the resonant $L_1C_1$ circuit and injection of the harmonic voltage at appropriate phase at the point of common coupling through the transformer $T_1$ so as to limit the voltage distortion in the power system as described earlier.

The functioning of the harmonic filter of the invention is explained theoretically as follows: The impedance of the parallel resonant $L_1C_1$ circuit tuned to the fundamental frequency of the power system is very high (theoretically infinity for a parallel combination of an ideal inductor and ideal capacitor) and are characterized by the following equations:

$$Z=(R^2+X^2)$$

$$X=(X_L \times X_C)/(X_L+X_C)$$

where Z is the ac impedance, R is the resistance, X is the ac reactance, L is inductance, C is capacitance, $X_L$ is inductive reactance and $X_C$ is capacitive reactance.

At tuned frequency $X_L=X_C$ and the impedance of the parallel resonant circuit tuned to the fundamental frequency of the power system is very high and effectively blocks the flow of the fundamental current at the tuned frequency through the harmonic filter.

Similarly the series resonant $L_2C_2$ circuit tuned to the fundamental frequency of the power system offers a very low (ideally zero) impedance at the tuned frequency as per the following equation:

$$Z=(R^2+X^2)$$

$$X=(X_L-X_C)$$

At frequency tuned to the frequency of the power system $X_L=X_C$ and hence the impedance at tuned frequency is zero, neglecting the resistance.

The transformation ratio of transformer $T_2$ is chosen based on the transformation ratio of transformer $T_1$ as to maintain a unity transformation ratio between the two transformers $T_1$ and $T_2$. The polarity of the transformer $T_2$ is so chosen as to inject the harmonic current/voltage signals in phase opposition to the harmonic current/voltage signals as to dynamically cancel the harmonic currents/voltage flowing into the voltage source.

Figure 6:
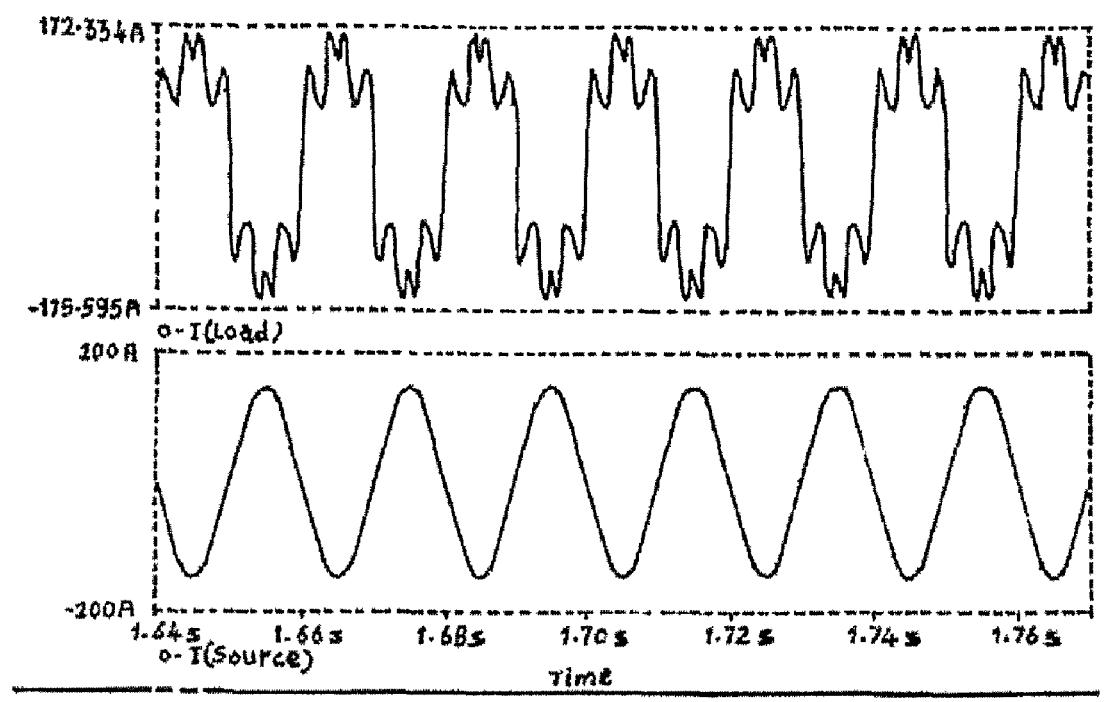
FIG. 6 is a computer simulated load and source current wave forms obtained with the harmonic filter in operation in the circuit diagram of FIG. 5.
Figure 10:
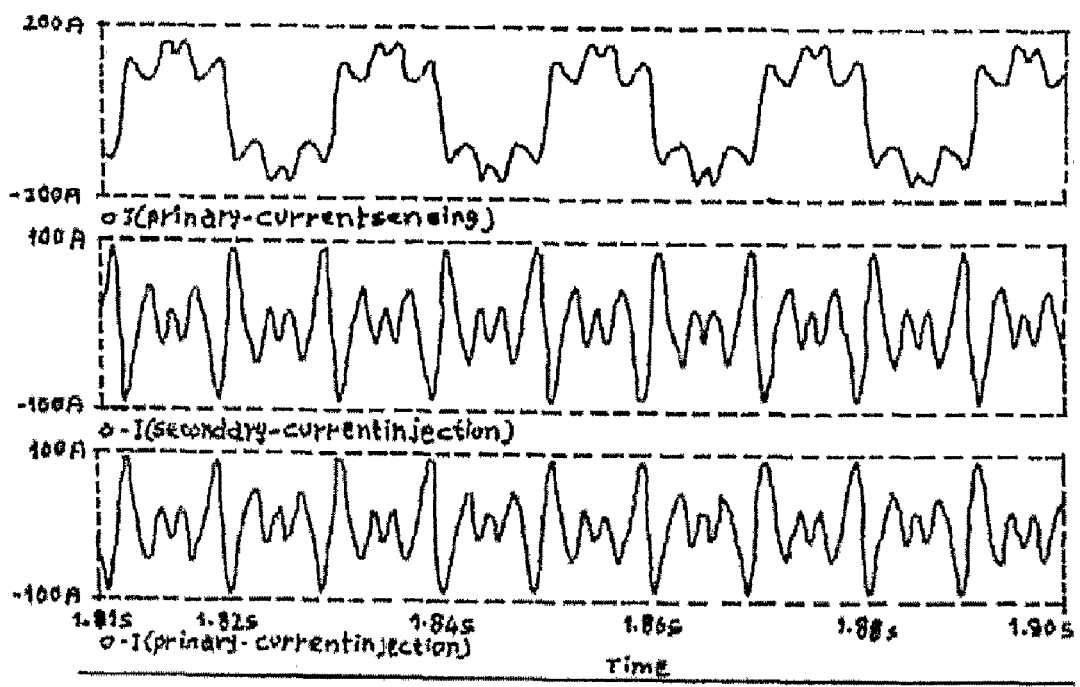
FIG. 10 is a computer simulated current wave forms in the primary and secondary of the current injection transformer and primary of current sensing transformer with the dynamic filter in operation in the circuit diagram of FIG. 5.
Figure 11:
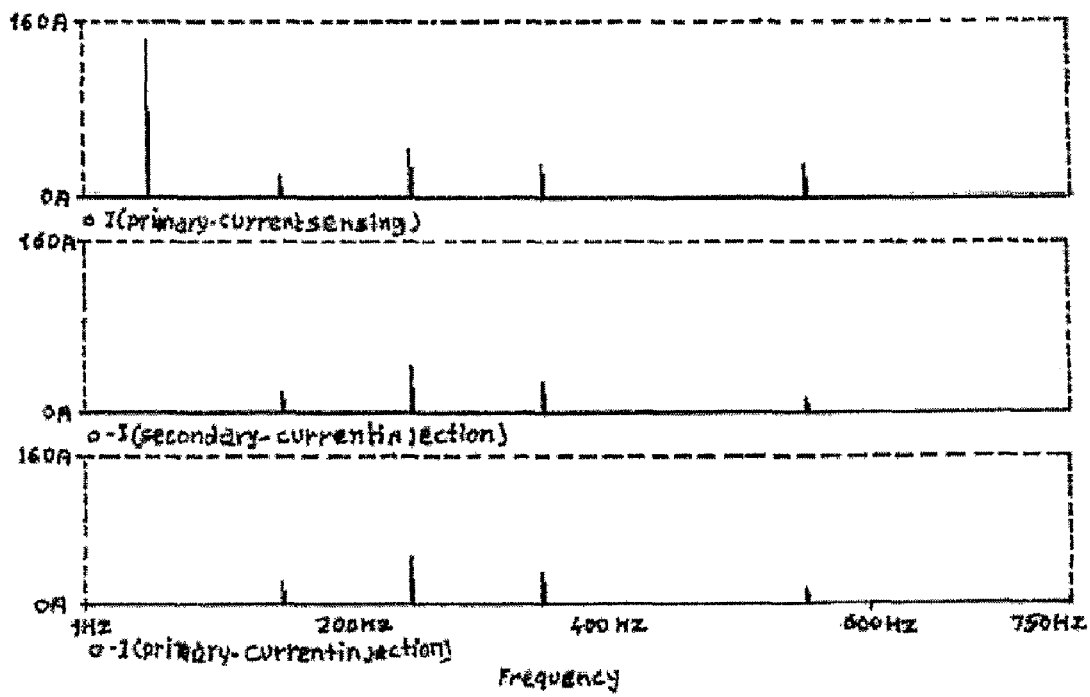
FIG. 11 is a computer simulated harmonic spectrum of current flowing in the primary and secondary of current injection transformer and primary of current sensing transformer with the current harmonic filter in operation in the circuit diagram of FIG. 5.

The load current comprising of both fundamental and harmonic components flows through the primary of the current sensing transformer, $T_1$ (FIG. 6). This current in the primary of the current sensing transformer produces a proportional current in the secondary of the current sensing transformer. This current in the secondary of the current sensing transformer closes its path through the secondary of the current injection transformer and the parallel tuned $L_1C_1$ circuit. The parallel tuned $L_1C_1$ circuit tuned to fundamental frequency offers a high impedance to the flow of fundamental current and hence only harmonic components flow through this circuit and the secondary of the current injection transformer (FIGS. 10 and 11). The series tuned $L_2C_2$ circuit offers low negligible impedance for the flow of the fundamental component flowing in the secondary of the current sensing transformer, thereby further reducing the voltage developed across the secondary of the current sensing transformer and further reducing the flow of fundamental component of the current through the secondary of the current injection transformer. The harmonic components flowing in the secondary of the current injection transformer produce a proportional current in the primary of the current injection transformer. The transformation ratio and polarities of the two transformers (T1 and T2) are so chosen as to obtain a net transformation ratio of unity and a phase reversal (of 180 degrees) as to inject the harmonics components derived from load current at phase opposition to cancel the harmonics (FIGS. 8, 9, 10 and 11). According to the invention the harmonic components are thus extracted from the load current and injected at an appropriate point in the circuit/system with their phase reversed and magnitude preserved as to cancel the harmonic currents.

In the typical harmonic filter of FIG. 5 of the accompanying drawings used for computer simulation the transformation ratio of the transformer $T_1$ was 5/1 and the transformation ratio of the transformer $T_2$ was 1/5. The series resonant $L_2C_2$ circuit was made up of an inductance of 22.02 mH connected in series with a capacitor bank of 460 uF. The parallel resonant $L_1C_1$ circuit comprised of an inductor of value 22.02 mH in parallel with a capacitor of value 460 uF. The Q factor of both the inductors was 12. The circuit used for computer simulation included circuit resistance, and self resistance of inductor, capacitor and transformer and other components such as source impedance to capture practical conditions. An additional switch So was also used in the circuit diagram of FIG. 5. The harmonic filter was tested on an actual load with a total current harmonic distortion of 22%. The introduction of the filter reduced the total current harmonic distortion to 2% from the original value of 22%. The harmonic filter was also tested on an actual load with a total voltage harmonic distortion of 20%. The introduction of the filter reduced the total voltage harmonic distortion to 3% from the original value of 20%. The filter was also tested for harmonic frequencies from 150 Hz to 6000 Hz and was found to be effective in eliminating the harmonics over the entire range of tested frequencies. The filter was effectively connected or disconnected from the circuit by operating the switches Sa, Sb and So to study the performance of the filter.

Figure 7:
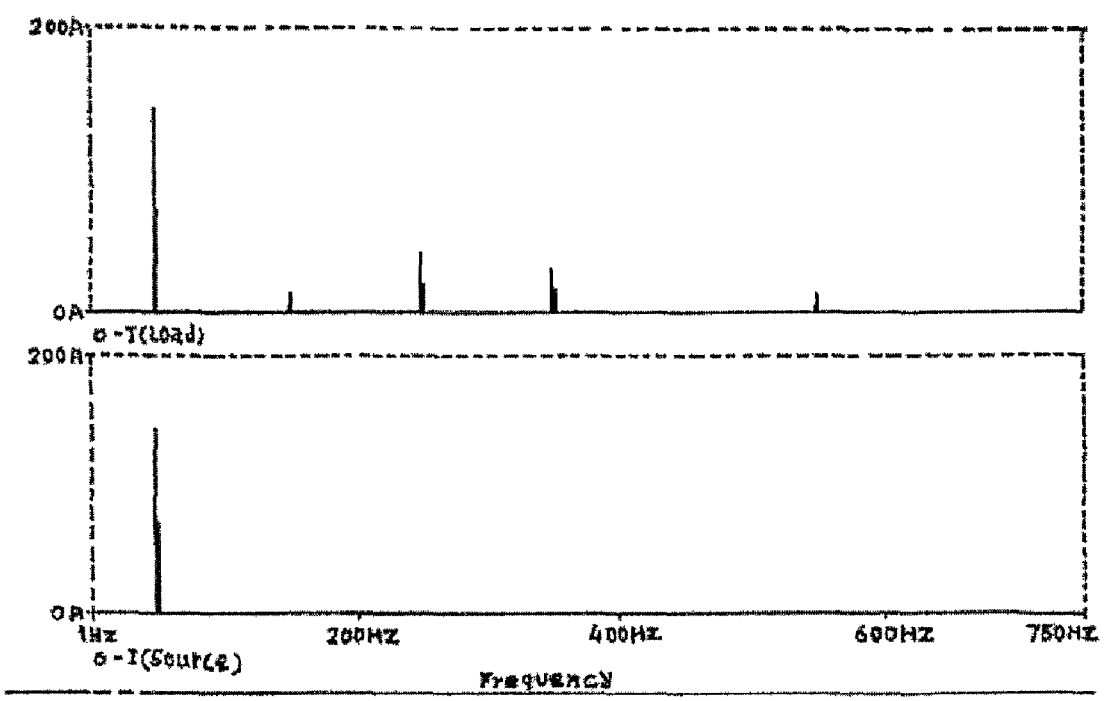
FIG. 7 is a computer simulated harmonic spectrum of load and source currents wave forms obtained with the harmonic filter in operation in the circuit diagram of FIG. 5.
Figure 8:
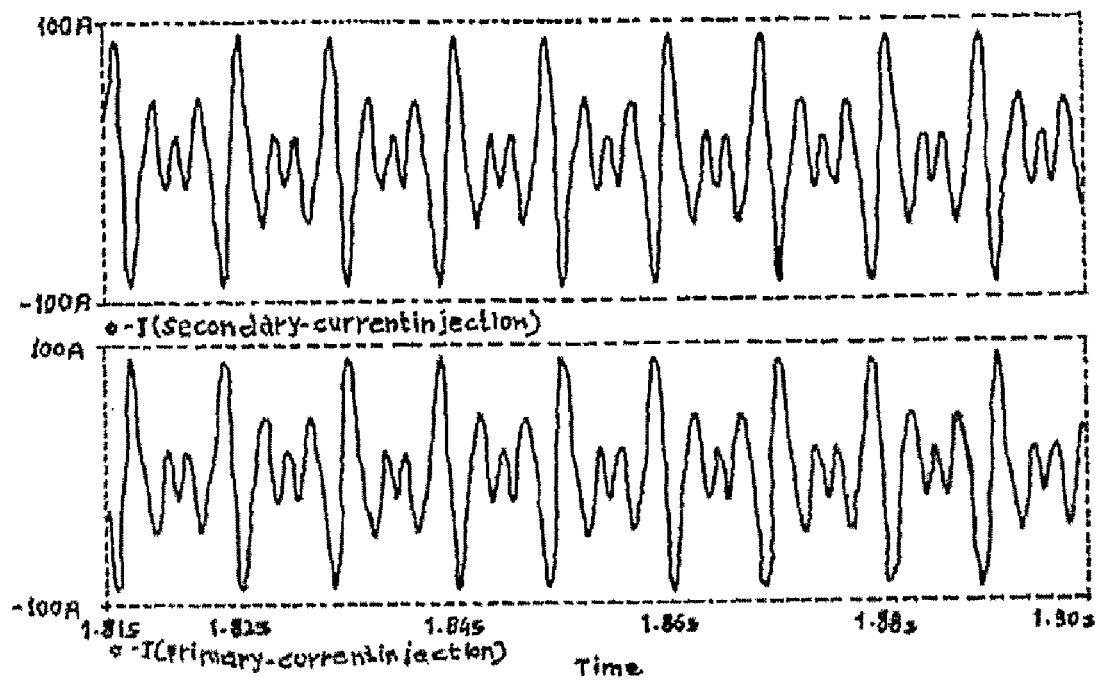
FIG. 8 is a computer simulated current wave forms in the primary and secondary of current injection transformer with the harmonic filter in operation in the circuit diagram of FIG. 5.
Figure 9:
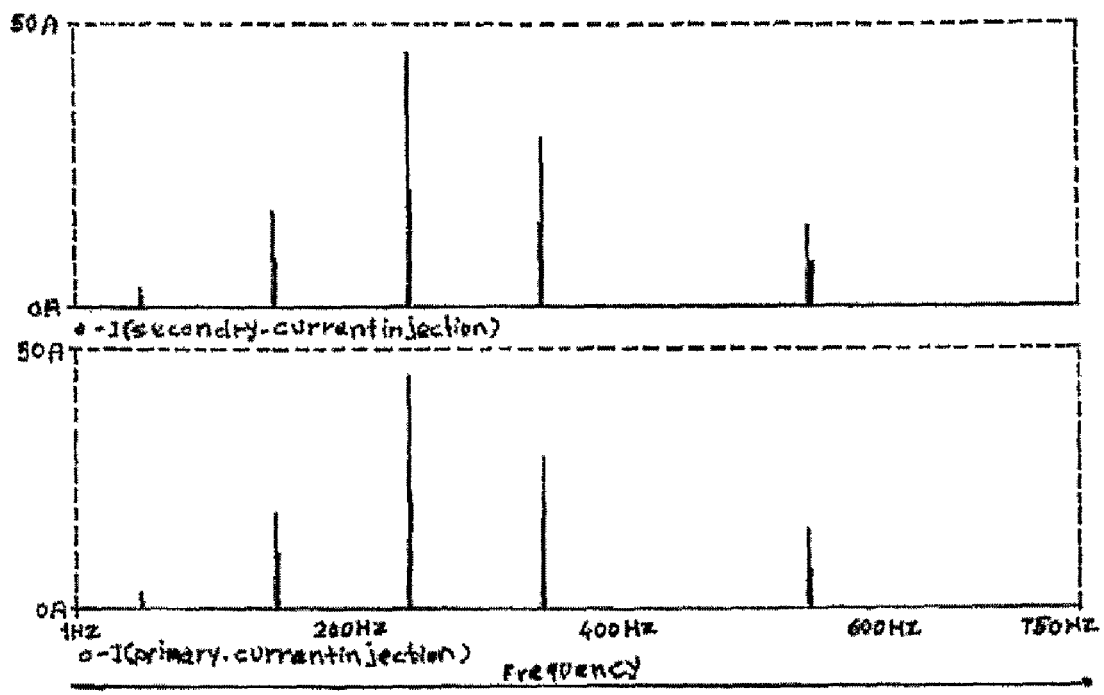
FIG. 9 is a computer simulated harmonic spectrum of current wave forms in the primary and secondary of the current injection transformer with the dynamic filter in operation in the circuit diagram of FIG. 5.
Figure 12:
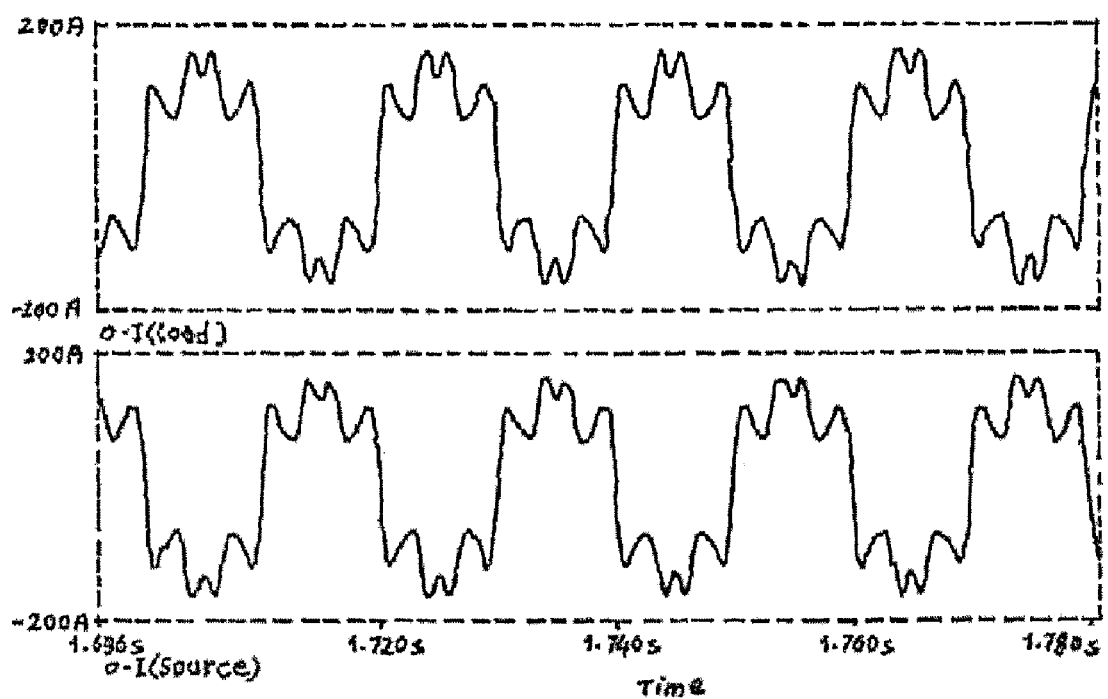
FIG. 12 is a computer simulated load and source currents wave forms without the current harmonic filter in operation in the circuit diagram of FIG. 5.

It is evident from the current waveforms in FIG. 6 of the accompanying drawings (with Sb closed and Sa open in FIG. 5) that the harmonic filter is able to effectively filter out all the harmonics generated by the load. It is evident from the current waveforms in FIG. 7 of the accompanying drawings (with Sa open and Sb closed in FIG. 5) that the current harmonic filter is able to filter out all the harmonics ($3^{rd}$, $5^{th}$, $7^{th}$ and $11^{th}$ used in simulation) very effectively thereby drawing a clean sinusoidal current waveform from the voltage source. The phase reversal is clearly understood from the wave forms in FIG. 8 of the accompanying drawings which shows the current flowing in the primary and secondary of current injection transformer with the current harmonic filter in operation (i.e., with the switch Sa open and switch Sb closed in FIG. 5). The harmonic spectrum of FIG. 9, FIG. 10 and FIG. 11 of the accompanying drawings (i.e., with the switch Sa open and switch Sb closed in FIG. 5) clearly indicates that the parallel tuned blocking circuit $L_1C_1$ has effectively blocked out the fundamental component and only the harmonic components ($3^{rd}$, $5^{th}$, $7^{th}$, and $11^{th}$ used in simulation) are circulating in the secondary of the current injection transformer. FIG. 8, FIG. 9, FIG. 10, and FIG. 11 of the accompanying drawings (i.e., with the switch Sa open and switch Sb closed in FIG. 5) clearly illustrate the phase reversal of the harmonic currents in the secondary and primary of the current injection transformer and the blocking of the fundamental current component that is flowing in the primary of current sensing transformer. The current waveforms in the secondary and primary winding of the transformer $T_2$ indicate the phase shift provided by this transformer to cancel the harmonics. The waveform of the current injected in phase opposition with the load currents illustrates that extraction of harmonic components and their injection in phase opposition to cancel the harmonics in the load current makes it possible to draw a clean sinusoidal current at fundamental frequency from the voltage source. FIG. 8, FIG. 9, FIG. 10, and FIG. 11 of the accompanying drawings (i.e., with the switch Sa open and switch Sb closed in FIG. 5) clearly show that the blocking of the fundamental current component that is flowing in the primary of current sensing transformer and the presence of only harmonic components ($3^{rd}$, $5^{th}$, $7^{th}$ and $11^{th}$ used in simulation) in the secondary and primary of current injection transformer. It is evident from the current wave forms in FIG. 12 and FIG. 13 of the accompanying drawings (i.e., with the switch Sb open, switch Sa closed and switch So open in FIG. 5) that the current harmonics generated by the load flows into the voltage source without the dynamic harmonic filter in operation and effect the power quality. FIG. 12 and FIG. 13 of the accompanying drawings (i.e., with the switch Sb open, switch Sa closed and switch So open in FIG. 5) shows that the current harmonics generated by the load ($3^{rd}$, $5^{th}$, $7^{th}$ and $11^{th}$ used in simulation) flows into the voltage source without the dynamic harmonic filter in operation and effect the power quality. The wave forms in FIG. 14 of the accompanying drawings (i.e., with switch Sb open, switch Sa closed and switch So open) along with those illustrated in FIGS. 12 and 13 (obtained under same operating conditions) clearly indicate the effective performance and functioning of the dynamic harmonic filter.

Depending upon the configuration of the harmonic filter of the invention, it filters a wide spectrum of multiple current harmonics or voltage harmonics or both multiple current and voltage harmonics simultaneously. It is simple in construction and is economical because it uses simple and conventional passive components such as inductors, capacitors and two winding transformers. It reduces harmonic loading on the upstream power equipments in the power systems due to harmonic filtering. Therefore, power delivered to the loads is of improved quality. The performance of the harmonic filter of the invention is not very sensitive to system frequency variations because the performance depends upon the parallel tuned blocking filter i.e., $L_1C_1$ circuit, whose impedance characteristics are not as variable with frequency as compared to series tuned filters. It reduces harmonic distortion in voltage being applied to down stream equipments in the system. Therefore, voltage applied across the load(s) is of improved quality. As the harmonic filter of the invention filters a wide spectrum of multiple harmonic components effectively, it prevents malfunctioning and failure of equipments in the power system. The harmonic filter of the invention also ensures continued normal operation of the power system in the event of fault in the harmonic filter. It also isolates the filter from the power system in the event of a fault in the filter circuit and ensures continued operation of the power system. It is dynamic in nature as it filters multiple harmonics over a very large frequency range and the efficiency of filtering can be maximized through tuning of the parallel and series tuned $L_1C_1$ and $L_2C_2$ circuits by varying the inductance and capacitance values.

The invention claimed is:

1. A dynamic harmonic filter for an AC power system comprising at least one voltage source and at least one load, the harmonic filter comprising a current sensing or voltage injection transformer connected in series with the voltage source and the load with one end of the primary of the current sensing or voltage injection transformer connected to the voltage source and the other end of the primary of the current sensing or voltage injection transformer connected to the load, a current injection or voltage sensing transformer connected in parallel with the voltage source with one end of the primary of the current injection or voltage sensing transformer connected to the point of common coupling between the voltage source and the primary of the current sensing or voltage injection transformer and the other end of the primary of the current injection or voltage sensing transformer earthed, the net transformation ratio between the two transformers being unity and a parallel resonant LC circuit tuned to the fundamental frequency of the power system, one end of the secondary of the current injection or voltage sensing transformer being connected to one junction of the parallel resonant LC circuit and the other end of the secondary of the current injection or voltage sensing transformer being connected to the other junction of the parallel resonant LC circuit through the secondary of the current sensing or voltage injection transformer.

2. A dynamic harmonic filter as claimed in claim 1, which includes a series resonant LC circuit tuned to the fundamental frequency of the power system and connected across the secondary of the current sensing or voltage injection transformer.

3. A dynamic harmonic filter as claimed in claim 2, wherein the tuning frequency of the series resonant LC circuit is variable.

4. A dynamic harmonic filter as claimed in claim 1, which includes a series resonant LC circuit tuned to the fundamental frequency of the power system and connected across the secondary of the current sensing or voltage injection transformer and a first bypass switch connected across the primary of the current sensing or voltage injection transformer.

5. A dynamic harmonic filter as claimed in claim 4, wherein the tuning frequency of the series resonant LC circuit is variable.

6. A dynamic harmonic filter as claimed in claim 1, which includes a series resonant LC circuit tuned to the fundamental frequency of the power system and connected across the secondary of the current sensing or voltage injection transformer, a first bypass switch connected across the primary of the current sensing or voltage injection transformer and a second bypass switch connected in series with the one end of the primary of the current injection or voltage sensing transformer.

7. A dynamic harmonic filter as claimed in claim 6, wherein the tuning frequency of the series resonant LC circuit is variable.

8. A dynamic harmonic filter as claimed in claim 1, wherein the transformation ratios of the two transformers are variable such that the net transformation ratio between the two transformers is unity.

9. A dynamic harmonic filter as claimed in claim 1, wherein the tuning frequency of the parallel resonant LC circuit is variable.

10. A dynamic harmonic filter as claimed in claim 1, wherein the current sensing or voltage injection transformer is a series transformer and the current injection or voltage sensing transformer is a shunt transformer.

11. A dynamic harmonic filter as claimed in claim 1, which is a current harmonic filter or a voltage harmonic filter or a combined harmonic filter for simultaneous filtration of both current and voltage harmonics.

12. An AC power system comprising at least one voltage source and at least one load and a dynamic harmonic filter comprising a current sensing or voltage injection transformer connected in series with the voltage source and the load with one end of the primary of the current sensing or voltage injection transformer connected to the voltage source and the other end of the primary of the current sensing or voltage injection transformer connected to the load, a current injection or voltage sensing transformer connected in parallel with the voltage source with one end of the primary of the current injection or voltage sensing transformer connected to the point of common coupling between the voltage source and the primary of the current sensing or voltage injection transformer and the other end of the primary of the current injection or voltage sensing transformer earthed, the net transformation ratio between the transformers being unity and a parallel resonant LC circuit tuned to the fundamental frequency of the power system, one end of the secondary of the current injection or voltage sensing transformer being connected to one junction of the parallel resonant LC circuit and the other end of the secondary of the current injection or voltage sensing transformer being connected to the other junction of the parallel resonant LC circuit through the secondary of the current sensing or voltage injection transformer.

13. An AC power system as claimed in claim 12, which includes a series resonant LC circuit tuned to the fundamental frequency of the power system and connected across the secondary of the current sensing or voltage injection transformer.

14. An AC power system as claimed in claim 13, wherein the tuning frequency of the series resonant LC circuit is variable.

15. An AC power system as claimed in claim 12, which includes a series resonant LC circuit tuned to the fundamental frequency of the power system and connected across the secondary of the current sensing or voltage injection transformer and a first bypass switch connected across the primary of the current sensing or voltage injection transformer.

16. An AC power system as claimed in claim 15, wherein the tuning frequency of the series resonant LC circuit is variable.

17. An AC power system as claimed in claim 12, which includes a series resonant LC circuit tuned to the fundamental frequency of the power system and connected across the secondary of the current sensing or voltage injection transformer, a first bypass switch connected across the primary of the current sensing or voltage injection transformer and a second bypass switch connected in series with the one end of the primary of the current injection or voltage sensing transformer.

18. An AC power system as claimed in claim 17, wherein the tuning frequency of the series resonant LC circuit is variable.

19. An AC power system as claimed in claim 12, wherein the transformation ratios of the two transformers are variable such that the net transformation ratio between the two transformers is unity.

20. An AC power system as claimed in claim 12, wherein the tuning frequency of the parallel resonant LC circuit is variable.

21. An AC power system as claimed in claim 12, wherein the current sensing or voltage injection transformer is a series transformer and the current injection or voltage sensing transformer is a shunt transformer.

22. An AC power system as claimed in claim 12, wherein the harmonic filter is a current harmonic filter or a voltage harmonic filter or a combined harmonic filter for simultaneous filtration of both current and voltage harmonics.

23. An AC power system as claimed in claim 12, which is single phase, three phase or multiphase, wherein the harmonic filter is correspondingly configured.

\* \* \* \* \*